(12) United States Patent
Aliane et al.

(10) Patent No.: US 9,318,453 B2
(45) Date of Patent: Apr. 19, 2016

(54) FLIP-CHIP HYBRIDISATION OF TWO MICROELECTRONIC COMPONENTS USING A UV ANNEAL

(71) Applicant: COMMISSARIAT A L'ENERGIE ATOMIQUE ET AUX ENERGIES ALTERNATIVES, Paris (FR)

(72) Inventors: Abdelkader Aliane, Grenoble (FR); Romain Coppard, Voiron (FR); Jamal Tallal, Grenoble (FR)

(73) Assignee: COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 0 days.

(21) Appl. No.: 14/421,689

(22) PCT Filed: Jul. 31, 2013

(86) PCT No.: PCT/FR2013/051852
§ 371 (c)(1),
(2) Date: Feb. 13, 2015

(87) PCT Pub. No.: WO2014/029930
PCT Pub. Date: Feb. 27, 2014

(65) Prior Publication Data
US 2015/0221602 A1      Aug. 6, 2015

(30) Foreign Application Priority Data

Aug. 21, 2012   (FR) ..................................... 12 57897

(51) Int. Cl.
*H01L 21/00* (2006.01)
*H01L 23/00* (2006.01)
(Continued)

(52) U.S. Cl.
CPC ............ *H01L 24/03* (2013.01); *H01L 21/4867* (2013.01); *H01L 23/145* (2013.01);
(Continued)

(58) Field of Classification Search
CPC ............... H01L 2924/01029; H01L 2924/053; H01L 2224/05647; H01L 2224/13147; H01L 2224/45147; H01L 2224/05147; H01L 2224/11849; H01L 2224/81; H01L 2224/48647; H01L 2224/818; H01L 2224/92; H01L 2224/81895; H01L 2224/11515; H01L 2224/215; H01L 2224/245; H01L 21/76834; H01L 21/4867; H01L 21/48; H01L 21/56; H01L 24/05; H01L 24/11; H01L 24/13; H01L 24/81; H01L 23/53228; H01L 23/14; H01L 23/495; H01L 23/00; H01L 23/498; H01L 31/02

See application file for complete search history.

(56) References Cited

U.S. PATENT DOCUMENTS 5,829,125 A * 11/1998 Fujimoto ............. B23K 1/0056
                                                              219/121.64
2004/0150967 A1   8/2004  Danvir et al.
2009/0127704 A1   5/2009  Lee

FOREIGN PATENT DOCUMENTS

JP    2006269119 A    10/2006
JP    2008208442 A    9/2008
WO    2012060262 A1   5/2012

OTHER PUBLICATIONS

International Search Report Application No. PCT/FR2013/051852 Date Completed: Nov. 28, 2013; Mailing Date: Dec. 5, 2013 pp. 3.

*Primary Examiner* — Chuong A Luu
*Assistant Examiner* — Cory Eskridge
(74) *Attorney, Agent, or Firm* — St. Onge Steward Johnston & Reens LLC

(57) ABSTRACT

A method of manufacturing a microelectronic device including a first component hybridized with a second component via electric interconnects, involves the steps of: (i) forming the first and second components, the second component being transparent to ultraviolet radiation at least in line with locations provided for the interconnects; (ii) forming interconnection elements including copper oxide on the second component at the locations provided for the interconnects; (iii) placing the first and second components on each other; and (iv) applying the ultraviolet radiation through the second component on the elements including copper oxide to implement an ultraviolet anneal converting copper oxide into copper.

11 Claims, 5 Drawing Sheets

(51) Int. Cl.
  *H01L 23/14* (2006.01)
  *H01L 23/498* (2006.01)
  *H01L 21/48* (2006.01)
  *H01L 21/56* (2006.01)

(52) U.S. Cl.
  CPC .......... *H01L23/49811* (2013.01); *H01L 24/05* (2013.01); *H01L 24/11* (2013.01); *H01L 24/13* (2013.01); *H01L 24/16* (2013.01); *H01L 24/81* (2013.01); *H01L 21/563* (2013.01); *H01L 2224/0219* (2013.01); *H01L 2224/02166* (2013.01); *H01L 2224/02175* (2013.01); *H01L 2224/0345* (2013.01); *H01L 2224/0361* (2013.01); *H01L 2224/03848* (2013.01); *H01L 2224/0401* (2013.01); *H01L 2224/05541* (2013.01); *H01L 2224/05568* (2013.01); *H01L 2224/05573* (2013.01); *H01L 2224/05639* (2013.01); *H01L 2224/05644* (2013.01); *H01L 2224/05647* (2013.01); *H01L 2224/05666* (2013.01); *H01L 2224/05669* (2013.01); *H01L 2224/10156* (2013.01); *H01L 2224/10175* (2013.01); *H01L 2224/1131* (2013.01); *H01L 2224/11332* (2013.01); *H01L 2224/11515* (2013.01); *H01L 2224/11848* (2013.01); *H01L 2224/13007* (2013.01); *H01L 2224/13109* (2013.01); *H01L 2224/13111* (2013.01); *H01L 2224/13147* (2013.01); *H01L 2224/13187* (2013.01); *H01L 2224/1601* (2013.01); *H01L 2224/16505* (2013.01); *H01L 2224/29035* (2013.01); *H01L 2224/73103* (2013.01); *H01L 2224/73203* (2013.01); *H01L 2224/818* (2013.01); *H01L 2224/819* (2013.01); *H01L 2224/8123* (2013.01); *H01L 2224/8184* (2013.01); *H01L 2224/81121* (2013.01); *H01L 2224/81192* (2013.01); *H01L 2224/81409* (2013.01); *H01L 2224/81948* (2013.01); *H01L 2224/83102* (2013.01); *H01L 2924/00014* (2013.01)

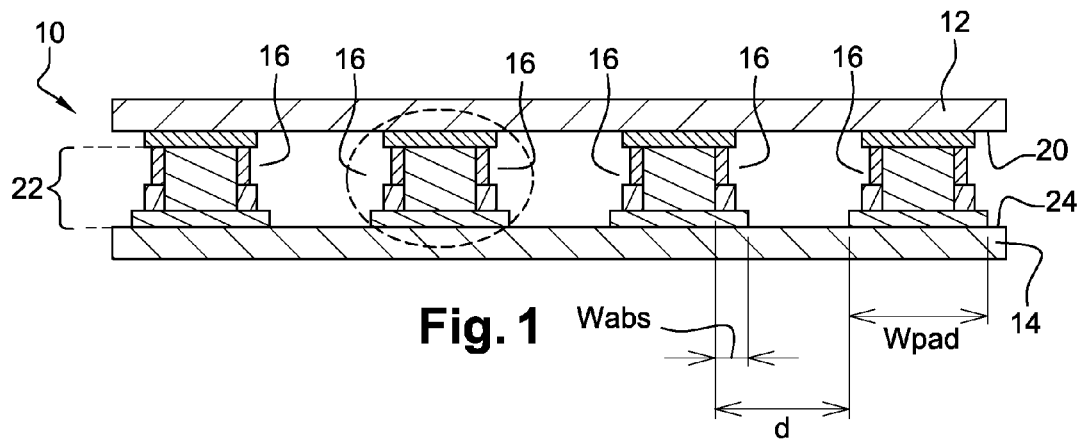
Fig. 1
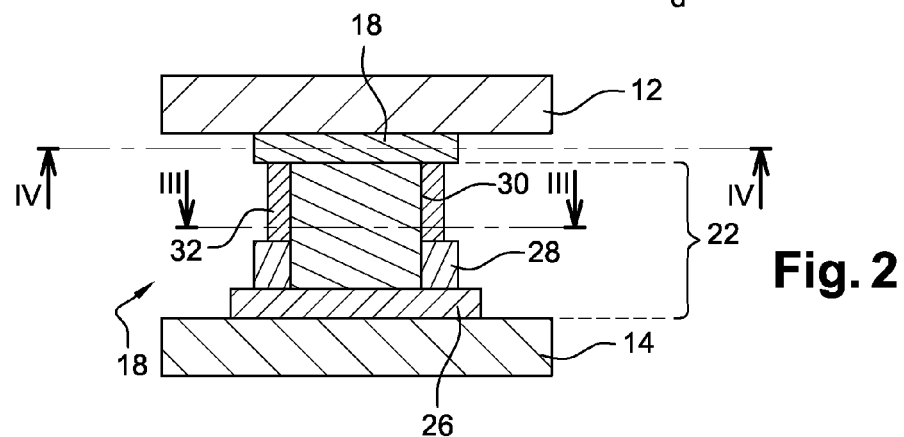
Fig. 2
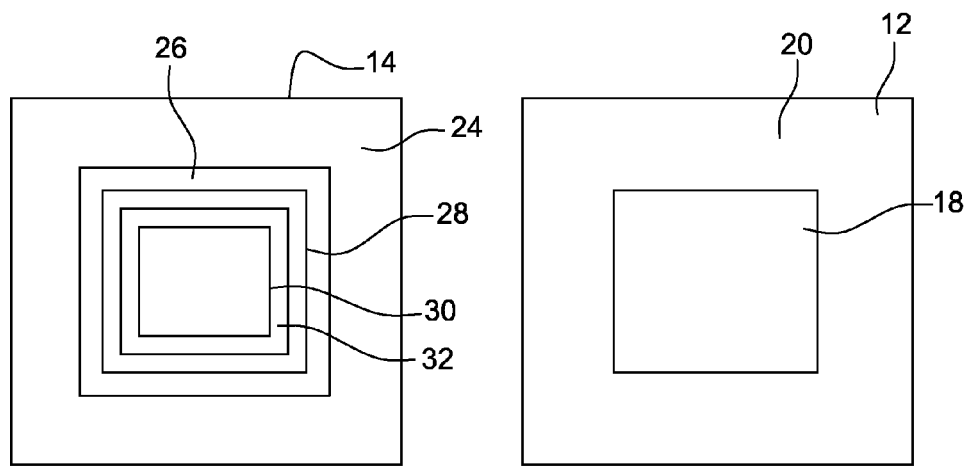
Fig. 3
Fig. 4

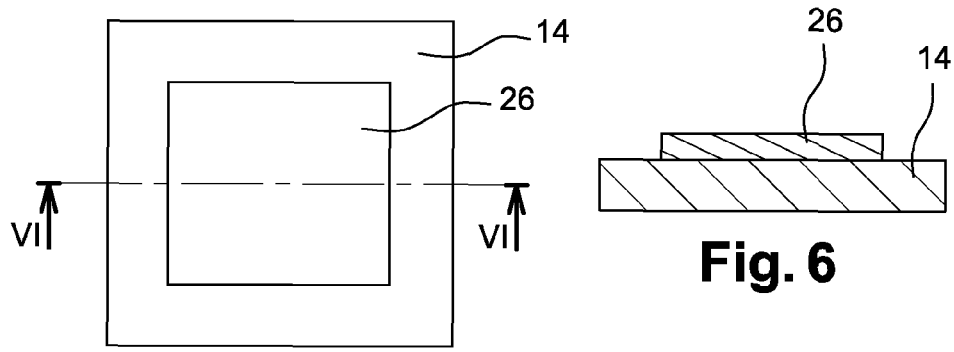
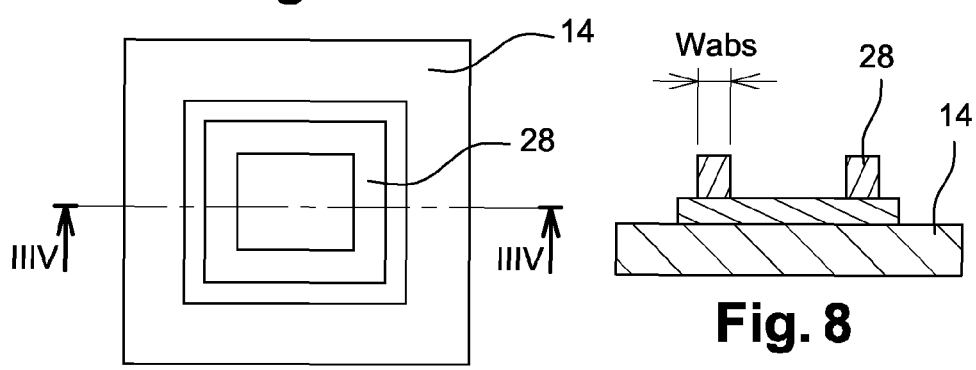
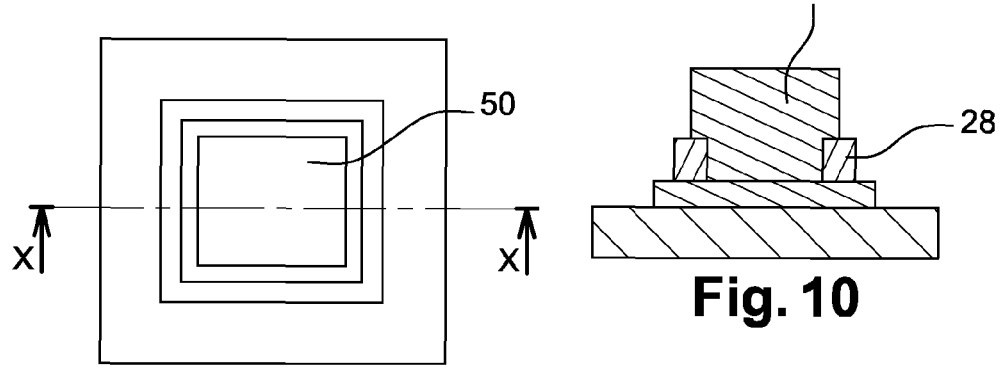
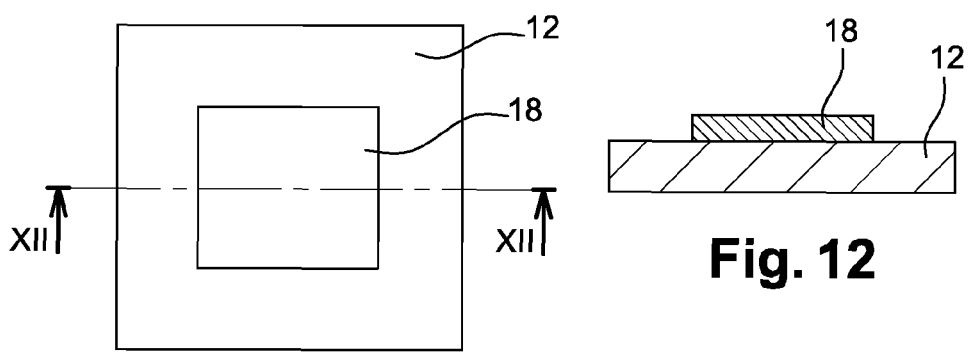

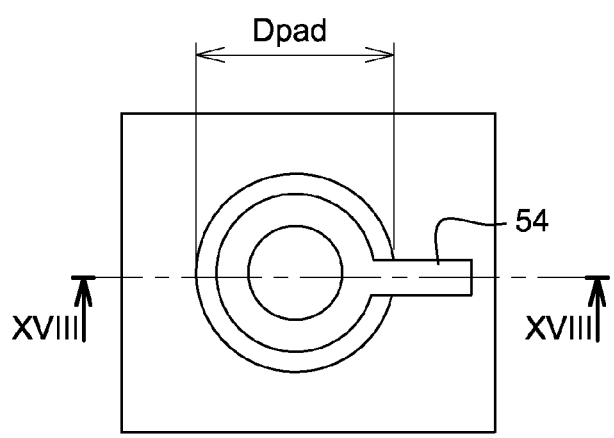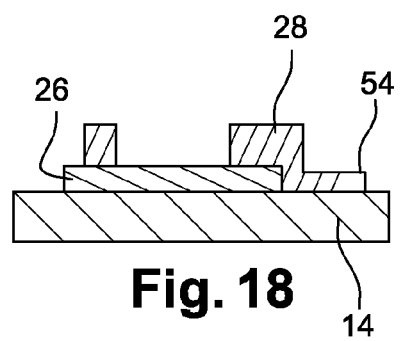

FLIP-CHIP HYBRIDISATION OF TWO MICROELECTRONIC COMPONENTS USING A UV ANNEAL

FIELD OF THE INVENTION

The invention relates to the "flip-chip" hybridization of two microelectronic components.

BACKGROUND OF THE INVENTION

Flip-chip hybridization is a technique where two microelectronic components, for example, an array of photosensitive elements and a circuit for reading it, are independently formed, and where these components are placed on each other while electric interconnects, necessary to their operation, are formed therebetween.

According to the state of the art, the interconnects are made in the form of solder bumps, arranged between metal areas wettable by the material forming the bumps, formed on opposite surfaces of the components. The hybridization method then comprises forming said areas on the surfaces of the components to be hybridized, depositing a solder material on the areas of a first component, placing the second component on the first component while aligning the areas of the two components, and then heating the assembly to a temperature melting the solder material to form the electric interconnects.

This type of hybridization however has the disadvantage of submitting the components to a significant thermal shock, the melting temperature of the materials of the bumps being usually greater than 152° C., this temperature being the melting temperature of the solder material, that is, tin. Such a heating may thus embrittle the components and/or forbid the use of materials which cannot withstand such temperatures, such as plastic materials, particularly PEN (polyethylene naphthalate) and PET (polyethylene terephthalate), which have a vitreous transition temperature usually much lower than the melting temperature of the solder materials.

SUMMARY OF THE INVENTION

The present invention aims at providing a method of manufacturing a device comprising a first and a second components hybridized by means of electric interconnects, which does not require taking the entire device to a high temperature to form said interconnects.

For this purpose, the invention aims at a method of manufacturing a microelectronic device comprising a first component hybridized with a second component by means of electric interconnects, comprising:
   forming first and second components, the second component being transparent to ultraviolet radiation at least in line with locations provided for the interconnects;
   forming interconnection elements comprising copper oxide on the second component at the locations provided for the interconnects;
   placing the first and second component on each other; and
   applying the ultraviolet radiation through the second component on the elements comprising copper oxide to implement an ultraviolet anneal converting copper oxide into copper.

"Transparent" here means a material which lets through enough ultraviolet radiation to allow an anneal of the copper oxide.

In other words, the reduction of the copper oxide into copper by a UV anneal requires no general heating of the device. Further, the application of the UV anneal does not induce, at the electric interconnects, a significant temperature rise, and thus enables to use materials such as plastics for the component manufacturing.

According to an embodiment, the forming of interconnection elements comprises, for each of these:
   forming an area on the second component, the area comprising a first region at least partially transparent to ultraviolet radiation surrounded with a second region less transparent than the first region;
   and depositing copper oxide on said area at least on the first region thereof.

Particularly, the second region is made of a material absorbing ultraviolet radiation or of a material reflecting ultraviolet radiation, advantageously a second region made of gold, titanium, or silver, having a thickness greater than 30 nanometers.

In other words, it is possible to control the copper oxide portion which is reduced into copper by delimiting it with a region which absorbs or reflects ultraviolet radiation. It is thus possible to form interconnects accurately limited in space, even in the case where a copper oxide ink, which spreads once deposited, is used.

According to an embodiment, the second component is made of PEN, PET, or glass, which materials are transparent to UVs and inexpensive. Further, PEN and PET have the advantage of being flexible materials.

According to an embodiment, the forming of the interconnects comprises forming a transparent metal oxide layer, particularly made of ITO (Indium tin oxide), of ATO (Antimony tin oxide), or of another electrically-conductive metal oxide transparent to UVs, on the second component. Such electrically-conductive metal oxides let through UVs and are used as electric connection pads after the conversion of CuO.

According to an embodiment, the ultraviolet anneal is achieved by a photonic pulse having a duration in the range from 0.5 millisecond to 2 milliseconds and having a fluence in the range from 200 Joules to 1,500 Joules, particularly a 1.5-millisecond duration and a 1,400 Joule fluence.

Such values thus enable to convert CuO into Cu from the rear surface of the flexible substrate, for example having a 125-μm thickness. In this case, it is spoken of applied energy. An order of magnitude for the fluence, which is 5.8 J/cm$^2$, 2 inches (5 cm) away from the Xenon lamp, may be mentioned.

BRIEF DESCRIPTION OF THE DRAWINGS

The present invention will be better understood on reading of the following description provided as an example only in relation with the accompanying drawings, where the same reference numerals designate the same or similar elements, among which:

FIG. 1 is a simplified cross-section view of a device according to the invention;

FIG. 2 is a view of a detail of FIG. 1, illustrating an interconnect according to the invention;

FIGS. 3 and 4 respectively are simplified cross-section views along plane III-III and IV-IV of FIG. 2;

FIGS. 5 to 14 are simplified top and cross-section views illustrating a method of manufacturing the device of FIG. 1;

FIGS. 17 and 18 respectively are simplified top and cross-section views of an alternative interconnect according to the invention;

DETAILED DESCRIPTION OF THE INVENTION

Figure 13:
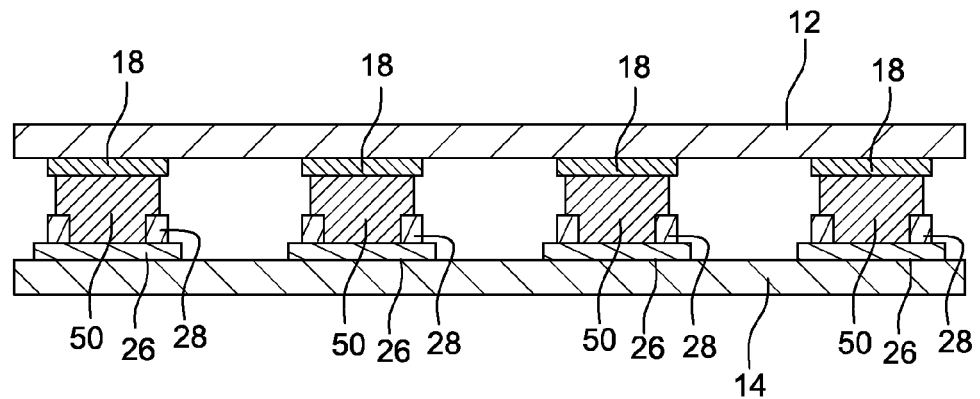

A device 10 according to the invention will be described in relation with FIGS. 1 to 4. Device 10 comprises a first and a second components 12, 14 hybridized to each other by mean of electric interconnects 16. First component 12 for example comprises an array of photosensitive elements, and the second component for example comprises a circuit for reading said array, interconnects 16 connecting each photosensitive element of the array to the read circuit. The second component is further transparent to ultraviolet radiation at least in line with interconnects 16. Particularly, the second component may be essentially made of flexible, low-cost and transparent plastic materials, such as PEN or PET, or also be made of glass, in which case the second component is transparent over its entire surface.

Interconnects 16 each comprise a solid conductive area 18 formed on a surface 20 of first component 12, for example, a metal area made of gold, silver, copper, platinum, titanium, or others, and an interconnection element 22 formed on a surface 24 of second component 14.

More particularly, interconnection element 22 comprises:
- a solid conductive area 26 transparent to ultraviolet radiation, formed on surface 24 of component 14, advantageously an area made of a conductive metal oxide, such as ITO (indium tin oxide) or ATO (antimony tin oxide), or of another conductive metal oxide transparent to UVs, such an oxide further having the advantage of bonding well to plastics and of having a good electric conductivity;
- a ring 28 of material absorbing ultraviolet radiation, formed on transparent conductive area 26, for example, a gold, titanium, or silver layer;
- a copper pad 30 (Cu) formed in ring 28, and in contact with conductive area 18 of first component 12 and with conductive area 26 of second component 14;
- a copper pad 30 (Cu) formed in ring 28, and in contact with conductive area 18 of first component 12 and with conductive area 26 of second component 14.

Each interconnect 16 thus comprises an electrically-conductive path between first and second components 12, 14, formed of conductive areas 18, 26 and of copper pad 30.

A method of manufacturing above-described device 10 will now be described in relation with FIGS. 5 to 14, and more particularly a method which does not require using a high temperature to form electric connections 16. Except for possible optional thermal anneal steps described hereafter, the method is advantageously carried out at ambient temperature, no heating being implemented to form interconnects 16 between the two components 14, 16.

The method starts with the forming of component 14, transparent at least in line with the locations provided for interconnects 16, for example, a flexible low-cost component such as a PEN or PET plastic, or a glass component 14.

The method then carries on with the forming of interconnection elements 22. More particularly, for each of these, a square solid conductive area 26 transparent to ultraviolet radiation is formed on surface 24 of component 14, for example, by means of a full plate vapor deposition of a layer of conductive transparent oxide such as ITO, followed by a wet or plasma etching to define area 26 (FIG. 5 in top view and FIG. 6 in cross-section view along plane VI-VI of FIG. 5).

At a next step, a ring 28, having a square or circular cross-section and made of a material absorbing ultraviolet radiation, is deposited on area 26 while leaving the latter exposed inside of ring 28. For example, ring 28 is made of gold, platinum, or silver, and is formed by full plate vapor deposition followed by a wet or plasma etching (FIG. 7 in top view and FIG. 8 in cross-section view along plane VIII-VIII of FIG. 7).

The thickness of ring 28 is selected to sufficiently block the incident ultraviolet radiation on ring 28 through component 14, to avoid an ultraviolet anneal of copper oxide subsequently deposited on ring 28. Advantageously, when ring 28 is made of gold, silver, or titanium, the thickness of ring 28 is greater than or equal to 30 nanometers. Optionally, molecules having a high ultraviolet absorption power are mixed with the metal of ring 28 or directly deposited on the flexible substrate in the form of a ring if the deposition techniques are well mastered, for example, pyrene molecules, which for example enables to decrease the thickness of ring 28.

The method carries on with the deposition of a copper oxide 50 in ring 28, particularly the silk-screening deposition of a copper oxide ink, for example, ink "Metalon® ICI-020" or "Metalon® ICI-021" of Novacentrix, Tex., USA, to have the copper oxide extend higher than ring 28.

The ink, due to its nature, then spreads on the edge of ring 28, thickness $W_{abs}$ of ring 28 being advantageously selected to provide enough surface area for the ink to spread, and to prevent the latter from overflowing from ring 28 (FIG. 9 in top view and FIG. 10 in cross-section view along plane X-X of FIG. 11).

Copper oxide ink 50 is then dried by thermal anneal to form copper oxide pads.

Independently from the manufacturing of component 14 and of elements 26, 28, 50 just described, the method comprises forming first component 14 and solid conductive areas 18 of square cross-section, for example, by means of a full plate vapor deposition of a gold, titanium, platinum, copper, or silver layer on surface 20 of component 12, followed by a wet or plasma etching to define each area 18 (FIG. 11 in top view and FIG. 12 in cross-section view along plane XII-XII of FIG. 11).

Once components 12 and 14 and their interconnection elements have been formed as previously described, first component 12 is placed on second component 14 by aligning areas 18 with copper oxide pads 50 (FIG. 13 in cross-section).

Figure 14:
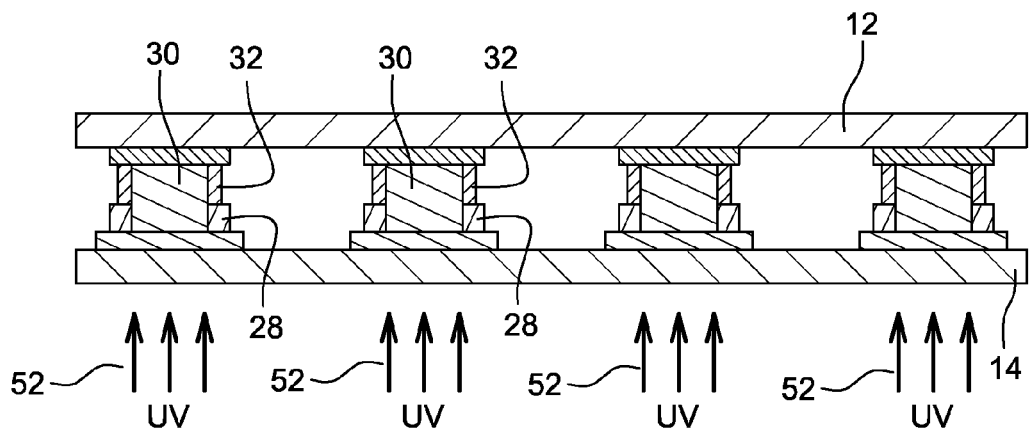

The method then carries on with the application of a photonic pulse in the ultraviolet wavelength range 52, particularly having a wavelength in the range from 200 nanometers to 700 nanometers, through second component 14 at least in line with each interconnect 16, the pulse being for example applied to the entire surface of second component 14 (FIG. 14). Ultraviolet pulse 52 has a duration in the range from 0.5 millisecond to 2 milliseconds, and an energy in the range from 200 Joules to 1,400 Joules, advantageously a 1.5-millisecond duration and a 1,400-Joule energy. Such energy values enable to convert CuO into Cu from the rear surface of the plastic PEN or PET substrate having a 125-µm thickness. Pulse 52 is for example produced by a flash UV lamp, particularly a "XENON® PulseForge" flash lamp produced by Xenon Corporation. Advantageously, the distance separating the lamp from component 14 is in the range from 3 centimeters to 7 centimeters, and more particularly 5 centimeters. This distance being the distance at which the optical system of the Xenon lamp focuses the sent light pulse, that is, the distance at which the energy is maximum.

UV pulse 52 then crosses second transparent component 14 and transparent conductive areas 26 and is incident on copper oxide portion 50 comprised in ring 28 of absorbing material.

At the same time, ring 28 of absorbing material at least partly blocks part of the ultraviolet pulse and thus at least partially prevents this pulse from reaching the copper oxide portion formed on ring 28. Ultraviolet pulse 52 then induces an anneal of the copper oxide in ring 28, which undergoes a reduction, thus forming copper pads 30 between conductive areas 18 and 26. Thus copper oxide, which is a poor electric conductor with a resistance per square in the order of $10^6 \Omega/\square$ and a poor heat conductor with a low heat conductivity equal to 33 W/m·K, is reduced into copper, which is a good electric conductor having a resistance per square equal to 60 m$\Omega/\square$, and a good heat conductor having a heat conductivity equal to 403 W/m·K.

Further, the anneal is carried out locally, that is, at the level of interconnects 16, and not on the assembly formed of components 12, 14 and of the interconnection elements, but the anneal further induces a temperature lower than 100° C., and thus a temperature lower than the vitreous transition temperature of PEN.

It should further be noted that rings 28 of absorbing material enable to accurately define the geometry of copper pads 30, and this, even if the copper oxide has been deposited by a technique which does not enable to accurately control this deposition.

Previously-described interconnects 16 exhibit a conductive area 26 on component 14, area 26 being used for the current flow between components 12 and 14. For example, there exist within the thickness of component 14 electric connections in contact with areas 26.

Figure 15:
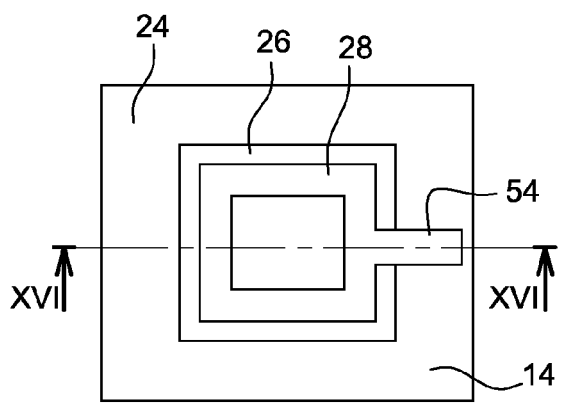
FIGS. 15 and 16 are simplified top and cross-section views of an alternative interconnect according to the invention.
Figure 16:
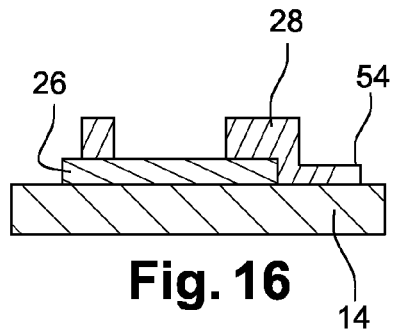

As a variation, as illustrated in FIG. 15 in top view and in FIG. 16 in cross-section view along plane XII-XII of FIG. 15, a metal track 54 forming one piece with conductive ring 28 is formed. Track 54 is in particular made of the same material as ring 28 and is formed jointly therewith. This track can thus be used for an electric connection with interconnect 16 on surface 24 of component 14.

Interconnects 16 having a square cross-section have been described. Of course, the interconnects may take any geometric shape, for example, a circular shape as illustrated in FIG. 17 in top view and in FIG. 18 in cross-section view along plane XVIII-XVIII of FIG. 17.

Particularly, the shape of interconnects 16 may thus be dictated by the shape of areas 26 formed on second component 14. Minimum distance d between two interconnects 16 may in particular be in the order of 30 micrometers with a minimum width $W_{pad}$ equal to 40 in the case of the square shape and a minimum diameter $D_{PAD}$ of 40 micrometers in the case of a circular shape. Minimum thickness $W_{abs}$ of rings 28 is for example 5 micrometers.

Similarly, rings of absorbing material for blocking ultraviolet radiation and thus preventing the annealing of the copper oxide laid on the rings have been described. As a variation, the ring is made of a reflective material which also blocks ultraviolet radiation. Also as a variation, the rings are omitted and component 14 is coated with a reflective or absorbing layer having openings in line with the locations provided for copper pads 32. Still as a variation, rings 28 are omitted, for example, if the application does not require an accurate definition of the copper pad geometry.

After the final hybridization of the two components and the conversion of CuO into Cu at the connection level, a non electrically-conductive ink NCP ("Non Conductive Paste") is dispensed, this step being followed by an anneal between 60 and 80° C. for a few minutes to mechanically strengthen the two hybridized components. For example, the ink is a non electrically-conductive epoxy resin. The dispensing is performed manually or automatically, and the ink may also be deposited by silk-screening.

Figure 19:
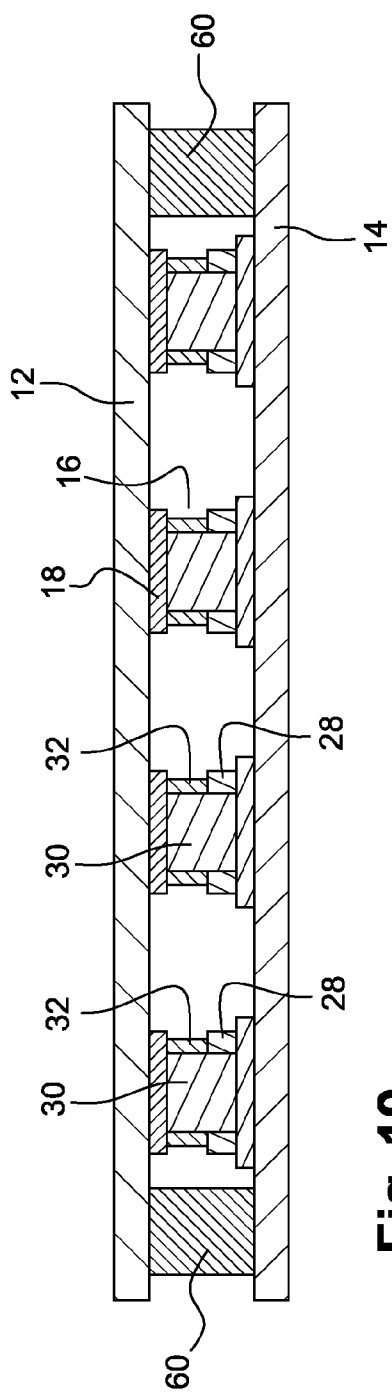
FIG. 19 is a simplified cross-section view of a device according to the invention with electrically non-conductive ink dispensed between the two hybridized components.
Figure 20:
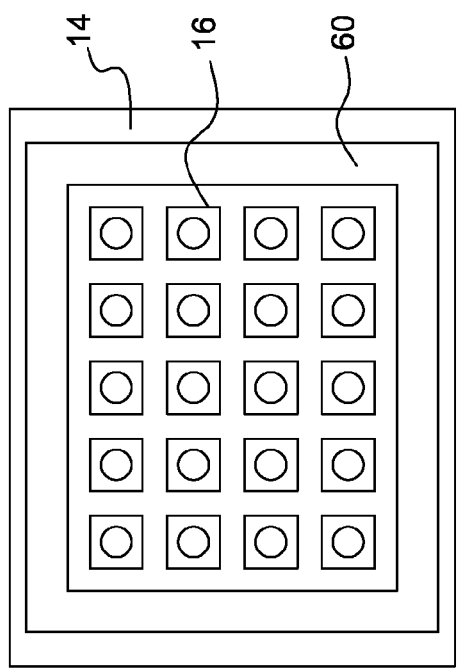
FIG. 20 is a top view of one of the components illustrating the shape of the ink.

For example, the NCP ink occupies the entire volume between the two components. As a variation, as illustrated in the cross-section view of FIG. 19, NCP ink 60 is deposited around interconnects 16, for example, in the form of a cord, as illustrated in FIG. 20 which is a top view of component 14, or of pads.

As a variation, the NCP ink is deposited on component 14 before component 12 is placed thereon, for example, by silk screening, after which component 12 is installed. An anneal such as described hereabove is then applied to solidify the ink.

The invention thus has the following advantages:
- the possibility of hybridizing a transparent component on another or a transparent substrate on an opaque substrate such as silicon, for example;
- the geometry of the rings blocking the ultraviolet radiation enables to obtain a small hybridization pitch;
- good electric and heat conductivities of the interconnects;
- a possibility of alignment from the transparent rear surface;
- a low cost and a mechanical flexibility, particularly due to the use of plastic;
- a direct passivation by the copper oxide of the vertical walls of the copper pads;
- an adaptation of the thermal expansion coefficients of the different assembled layers by the use of CuO ink; and
- a fast manufacturing.

The invention claimed is:

1. A method of manufacturing a microelectronic device comprising a first component hybridized with a second component by means of electric interconnects said method, comprising, the steps of:
    forming the first and second components, the second component being transparent to ultraviolet radiation at least in line with locations provided for the interconnects;
    forming interconnection elements comprising pads made only of copper oxide on the second component at the locations provided for the interconnects;
    placing the first and second components on each other; and
    applying ultraviolet radiation through the second component on the elements comprising pads made only of copper oxide to implement an ultraviolet anneal converting copper oxide into copper.

2. The microelectronic device manufacturing method of claim 1, wherein the forming of the interconnection elements comprises, for each of the interconnection elements, the steps of:
    forming an area on the second component, the area comprising a first region at least partially transparent to ultraviolet radiation surrounded with a second region less transparent than the first region to ultraviolet radiation; and
    depositing copper oxide on said area at least on the first region thereof.

3. The microelectronic device manufacturing method of claim 2, wherein the second region is made of a material absorbing ultraviolet radiation or of a material reflecting ultraviolet radiation.

4. The microelectronic device manufacturing method of claim 2, wherein the second region is made of gold, titanium, or silver.

5. The microelectronic device manufacturing method of claim 4, wherein the second region has a thickness greater than 30 nanometers.

6. The microelectronic device manufacturing method of claim 1, wherein the second component is made of PEN, PET, or glass.

7. The microelectronic device manufacturing method of claim 1, wherein the forming of the interconnects comprises forming a layer of transparent metal oxide, on the second component.

8. The microelectronic device manufacturing method of claim 1, wherein the ultraviolet anneal is achieved by a photonic pulse having a duration in the range from 0.5 millisecond to 2 milliseconds and having a fluence in the range from 200 Joules to 1,500 Joules.

9. The microelectronic device manufacturing method of claim 1, wherein after hybridization of the two components with each other, an electrically non-conductive ink is added, and wherein the final hybridized structure is then submitted to a step of annealing around from 60 to 80° C. for a few minutes to mechanically strengthen the two hybridized components.

10. The microelectronic device manufacturing method of claim 7, wherein the transparent metal oxide is ITO.

11. The microelectronic device manufacturing method of claim 8, wherein the photonic pulse has a duration of 1.5 milliseconds and has a fluence of 1,400 Joules.

\* \* \* \* \*